(12) United States Patent
Dikshit et al.

(10) Patent No.: US 10,090,209 B2
(45) Date of Patent: *Oct. 2, 2018

(54) METHODS OF PREDICTING UNITY GAIN FREQUENCY WITH DIRECT CURRENT AND/OR LOW FREQUENCY PARAMETERS

(71) Applicant: GLOBALFOUNDRIES INC., Grand Cayman (KY)

(72) Inventors: Amit A. Dikshit, Bangalore (IN); Tamilmani Ethirajan, Bangalore (IN); Shrinivas J. Pandharpure, Bangalore (IN); Vaidyanathan T. Subramanian, Bangalore (IN); Josef S. Watts, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/615,072

(22) Filed: Jun. 6, 2017

(65) Prior Publication Data

US 2017/0271213 A1 Sep. 21, 2017

Related U.S. Application Data

(62) Division of application No. 14/146,143, filed on Jan. 2, 2014, now Pat. No. 9,704,763.

(51) Int. Cl.
*H01G 7/00* (2006.01)
*H01L 21/66* (2006.01)
(Continued)

(52) U.S. Cl.
CPC .......... *H01L 22/14* (2013.01); *G01R 31/2621* (2013.01); *G06F 17/5036* (2013.01); *G06F 17/5063* (2013.01); *G01R 31/2625* (2013.01)

(58) Field of Classification Search
USPC ............................ 327/554; 330/253; 257/48
See application file for complete search history.

(56) References Cited

U.S. PATENT DOCUMENTS 5,942,766 A 8/1999 Frei
6,194,739 B1 2/2001 Ivanov et al.
(Continued)

OTHER PUBLICATIONS

Steininger, Understanding Wide-Band MOS Transistors, Circuits and Devices, pp. 26-31, May 1990.

*Primary Examiner* — Lam Nguyen
(74) *Attorney, Agent, or Firm* — Michael LeStrange; Hoffman Warnick LLC (57) ABSTRACT

Various embodiments include approaches for predicting unity gain frequency in a MOSFET. In some cases, a method includes predicting a unity gain frequency ($f_T$) in a MOSFET device in a manufacturing line, the method including: measuring a first set of in-line direct current (DC) parameters of the MOSFET on the manufacturing line at a first drain voltage ($V_{d1}$); extracting a transconductance ($G_m$) from the first set of in-line DC parameters as a function of a gate-voltage ($V_g$) and the first drain-voltage ($V_{d1}$); measuring a second set of in-line DC parameters of the MOSFET on the manufacturing line at a second drain voltage ($V_{d2}$); extracting a total gate capacitance ($C_{gg}$) from the second set of in-line DC parameters as a function of the gate-voltage ($V_g$); and predicting the unity gain frequency ($f_T$) of the MOSFET based upon the extracted transconductance ($G_m$) and the extracted total gate capacitance ($C_{gg}$).

7 Claims, 6 Drawing Sheets

(51) Int. Cl.
  *G06F 17/50*  (2006.01)
  *G01R 31/26*  (2014.01)

(56) References Cited

U.S. PATENT DOCUMENTS

| | | |
|---|---|---|
| 7,126,359 B2 | 10/2006 | Huang et al. |
| 7,397,259 B1 | 7/2008 | Agarwal et al. |
| 7,741,857 B2 | 6/2010 | Jagannathan et al. |
| 8,456,169 B2 | 6/2013 | Bhushan et al. |
| 2003/0006413 A1 | 1/2003 | Chawla et al. |

METHODS OF PREDICTING UNITY GAIN FREQUENCY WITH DIRECT CURRENT AND/OR LOW FREQUENCY PARAMETERS

CROSS-REFERENCE TO RELATED APPLICATION

This application is a divisional application of U.S. patent application Ser. No. 14/146,143, filed on Jan. 2, 2014, which received a Notice of Allowance on May 19, 2017, and is hereby incorporated by reference in its entirety.

TECHNICAL FIELD

Aspects of the invention relate generally to predicting metal-oxide-semiconductor field-effect transistor ("MOSFET") device parameters. More particularly, various aspects of the invention relate to predicting unity gain frequency using in-line direct current parameters and/or low frequency parameters.

BACKGROUND

Unity gain frequency ("$f_T$") of a MOSFET is an important radio-frequency parameter in analog circuit design. The unity gain frequency of a MOSFET is the frequency at which the amplifier's gain is equal to one. Oscillatory characteristics of a closed loop system begin at the unity gain frequency. Specific applications, such as envelope tracking systems, require precise control of $f_T$ variations in MOSFETs in a manufacturing line. If $f_T$ variations are not precisely controlled, the MOSFET will not oscillate properly, the gain will not be adequate, and the device capabilities will be affected.

Conventionally, radio-frequency statistics are generated using scattering parameter ("S-parameter") measurements. Unfortunately, characterization time for S-parameters can be high, and tools for measuring S-parameters can be expensive. In a manufacturing line, this results in a reduction in output. Furthermore, S-parameter structures are large and must be placed in an area-constrained kerf, restricting space and productivity.

BRIEF SUMMARY

Solutions for measuring MOSFET parameters are disclosed herein. Various embodiments include approaches for predicting a unity gain frequency in a MOSFET. Various additional embodiments include a method of calibrating a MOSFET device in a manufacturing line. In some cases, a method includes: measuring a first set of in-line direct current (DC) parameters of the MOSFET on the manufacturing line at a first drain voltage ($V_{d1}$); extracting a transconductance ($G_m$) from the first set of in-line DC parameters as a function of a gate-voltage ($V_g$) and the first drain-voltage ($V_{d1}$); measuring a second set of in-line DC parameters of the MOSFET on the manufacturing line at a second drain voltage ($V_{d2}$); extracting a total gate capacitance ($C_{gg}$) from the second set of in-line DC parameters as a function of the gate-voltage ($V_g$); and predicting the unity gain frequency ($f_T$) of the MOSFET based upon the extracted transconductance ($G_m$) and the extracted total gate capacitance ($C_{gg}$).

A first aspect includes a method of predicting a unity gain frequency ($f_T$) in a metal-oxide-semiconductor field-effect transistor (MOSFET) device in a manufacturing line, the method including: measuring a first set of in-line direct current (DC) parameters of the MOSFET on the manufacturing line at a first drain voltage ($V_{d1}$); extracting a transconductance ($G_m$) from the first set of in-line DC parameters as a function of a gate-voltage ($V_g$) and the first drain-voltage ($V_{d1}$); measuring a second set of in-line DC parameters of the MOSFET on the manufacturing line at a second drain voltage ($V_{d2}$); extracting a total gate capacitance ($C_{gg}$) from the second set of in-line DC parameters as a function of the gate-voltage ($V_g$); and predicting the unity gain frequency ($f_T$) of the MOSFET based upon the extracted transconductance ($G_m$) and the extracted total gate capacitance ($C_{gg}$).

A second aspect includes a method of calibrating a model for a metal-oxide-semiconductor field-effect transistor (MOSFET) device, the method including: measuring a set of scattering parameters of the MOSFET at a first gate-voltage ($V_{g1}$) and a first drain-voltage ($V_{d1}$); extracting a first total gate capacitance ($C_{gg1}$) from the set of scattering parameters as a function of the first gate-voltage ($V_{g1}$) and the first drain-voltage ($V_{d1}$); measuring a first set of in-line direct current (DC) parameters of the MOSFET at a second drain voltage ($V_{d2}$); extracting a second total gate capacitance ($C_{gg2}$) from the first set of in-line DC parameters as a function of a second gate-voltage ($V_{g2}$); measuring a second set of in-line DC parameters of the MOSFET at the first drain voltage ($V_{d1}$); extracting a drain-source resistance ($R_{ds}$) from the second set of in-line DC parameters as a function of the first gate-voltage ($V_{g1}$) and the first drain voltage ($V_{d1}$); and calibrating a model using the first total gate capacitance, the second total gate capacitance, and the drain-source resistance.

A third aspect includes a method of predicting a unity gain frequency ($f_T$) in a metal-oxide-semiconductor field-effect transistor (MOSFET) device in a manufacturing line, the method including: measuring a first set of in-line direct current (DC) parameters of the MOSFET on the manufacturing line at a first drain voltage ($V_{d1}$); extracting a transconductance ($G_m$) and a drain-source resistance ($R_{ds}$) from the first set of in-line DC parameters as a function of a first gate-voltage ($V_{g1}$) and the first drain-voltage ($V_{d1}$); measuring a second set of in-line DC parameters of the MOSFET on the manufacturing line at a second drain voltage ($V_{d2}$); extracting a first total gate capacitance ($C_{gg1}$) from the second set of in-line DC parameters as a function of the first gate-voltage ($V_{g1}$); predicting a second total gate capacitance ($C_{gg2}$) as a function of the first gate-voltage ($V_{g1}$) and the first drain-voltage ($V_{d1}$) from a calibration model from a calibration model; and predicting the unity gain frequency ($f_T$) of the MOSFET based upon the extracted transconductance ($G_m$) and the second total gate capacitance ($C_{gg2}$).

BRIEF DESCRIPTION OF THE DRAWINGS

It is noted that the drawings are not necessarily to scale. The drawings are intended to depict only typical aspects, and therefore should not be considered as limiting in scope. In the drawings, like numbering represents like elements between the drawings.

DETAILED DESCRIPTION

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Various particular embodiments include a method of predicting a unity gain frequency ($f_T$) in a metal-oxide-semiconductor field-effect transistor (MOSFET) device in a manufacturing line. Other particular embodiments include a method of calibrating a model for a MOSFET device in a manufacturing line.

In order to describe aspects of the various embodiments conveniently, the following technical terms are defined: $V_g$: gate-voltage; $V_d$: drain-voltage; $I_d$: drain current; $C_{gg}$: total gate capacitance; $R_{ds}$: drain-source resistance; $G_m$: transconductance; and $f_T$: unity gain frequency. In addition, it is understood that all references herein to drain-voltage, gate-voltage, and source-voltage, are taken at a drain contact, a gate contact, and a source contact of the MOSFET respectively.

Figure 1:
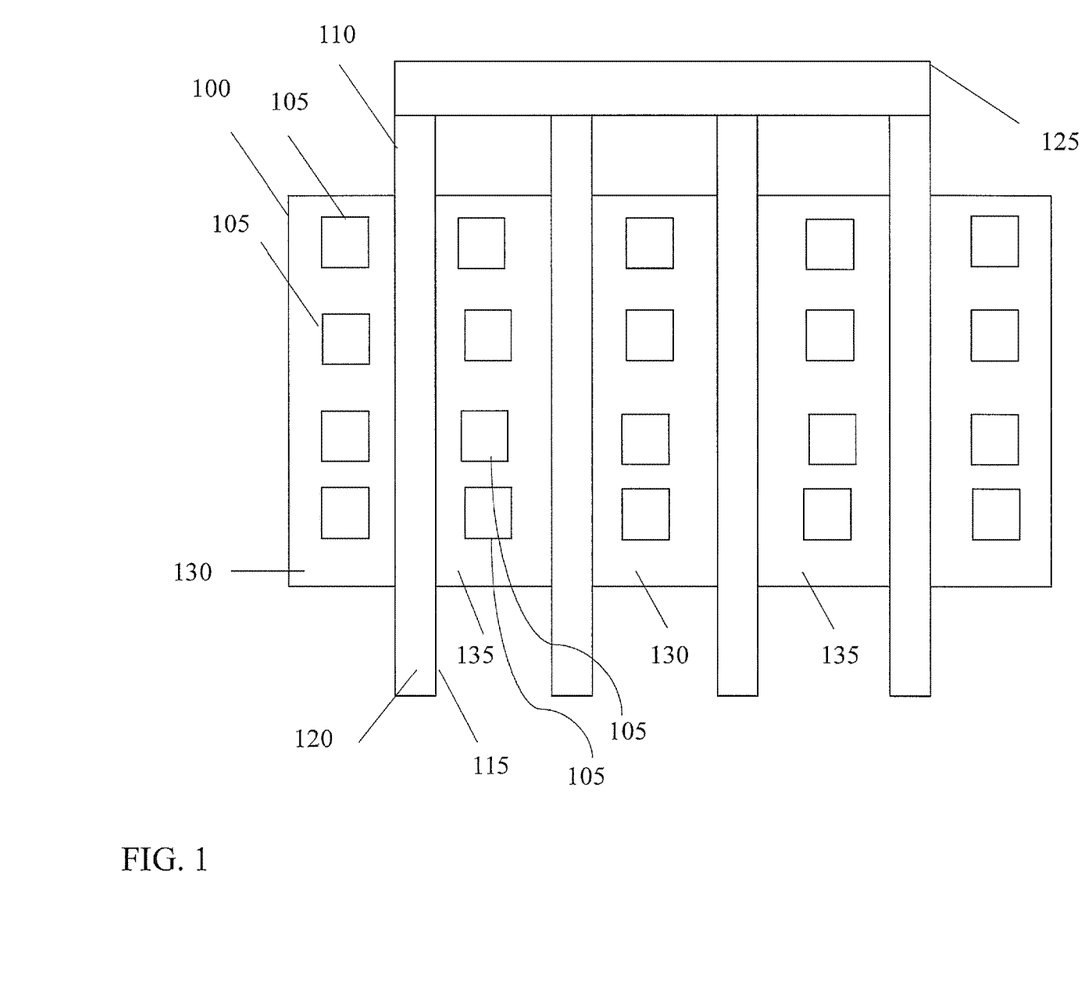
FIG. 1 shows a schematic diagram illustrating a test structure for measuring MOSFET parameters using in-line DC measurements according to various embodiments.

Turning to FIG. 1, a top view of a MOSFET 100 according various embodiments is disclosed. MOSFET 100 may include a four-terminal device having a source 130, a gate 125, a drain 135, and a body. It is understood that the body of MOSFET 100 can be tied to source 130 creating an internal short circuit, and resulting in an effective three terminal device. The resulting three terminals will be referred to as gate 125, drain 135, and source 130.

FIG. 1 discloses a multi-finger layout such that typical current-voltage characterization as well as capacitance-voltage characterization can be performed on the same structure. As is understood, the current-voltage characterization enables monitoring the relationship between the current and the corresponding potential difference across MOSFET 100. Similarly, capacitance-voltage characterization includes measuring capacitance as a function of the voltage in MOSFET 100.

As is understood, multi-finger layouts create parallel transistor gates (e.g., source, drain, and gate) with common parameters. As is depicted in FIG. 1, MOSFET 100 has a plurality of drain regions 135 each having a plurality of contacts 105, a plurality of source regions 130 each having a plurality of contacts 105, and a plurality of gate regions 125, where each gate region 125 is between each drain region 135 and source region 130. MOSFET 100 has a channel width larger than a channel length, with a perimeter defined along drain 135. The channel enables charge carriers, electrons or holes, to flow from source 130 to drain 135. Polysilicon fingers 120 extend along MOSFET 100 along a line equally spaced between drain region 135 and source region 130. Each finger has a drain side 115 and a source side 110 respectively. Contacts 105 along source region 130 and drain region 135 enable the measurement of the potential and current of source region 130 or drain region 135 along the surface of MOSFET 100.

It is noted that the number of fingers 120 disclosed in FIG. 1 are not intended to be limiting. According to various embodiments, MOSFET 100 may include any plurality of channels. For instance, the number of fingers may be from 100 to 1000.

Figure 2:
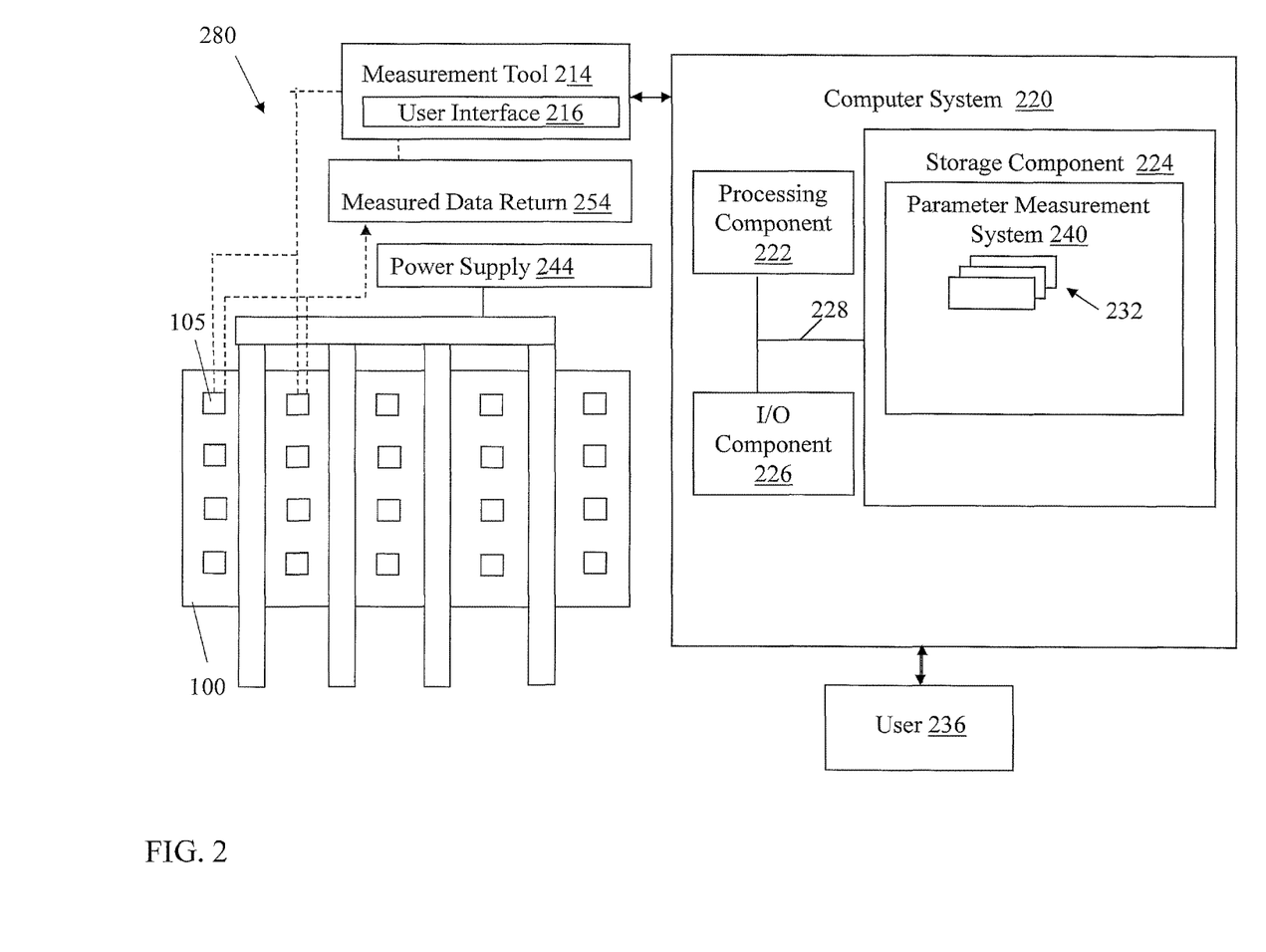
FIG. 2 shows a schematic environment for implementing a system for measuring MOSFET parameters using in-line DC measurements according to various embodiments.

Turning now to FIG. 2, a schematic depiction of a system 280 according to various embodiments is shown. As shown, system 280 can include a measurement tool 214 having a user interface 216, for measuring parameters of a MOSFET (e.g., MOSFET 100). Specifically, these parameters may include: drain voltage, gate voltage, source voltage, drain current, gate current, source current, resistance, including but not limited to drain-source resistance, and capacitance, including but not limited to gate capacitance. Also shown, in response to a measurement from the measurement tool, a measured data return 244, including the measured data (e.g., $V_g$, $V_d$, $I_d$, $I_g$), is returned. In some cases, system 280 can further include a power supply 244 for applying voltages to a MOSFET 100.

System 280 can further include at least one computer system 220, including a parameter measurement system 240, coupled with the measurement tool 214. The at least one computing system 220 is configured to perform actions to measure parameters of a MOSFET 100 in a manufacturing line.

Computer system 220 is shown including a processing component 222 (e.g., one or more processors), a storage component 224 (e.g., a storage hierarchy), an input/output (I/O) component 226 (e.g., one or more I/O interfaces and/or devices), and a communications pathway 228. In one embodiment, processing component 222 executes program code, such as parameter measurement system 240, which is at least partially embodied in storage component 224. While executing program code, processing component 222 can process data, which can result in reading and/or writing the data to/from storage component 224 and/or I/O component 226 for further processing. Pathway 228 provides a communications link between each of the components in computer system 220. I/O component 226 can include one or more human I/O devices or storage devices, which enable a user 236 (e.g., human or machine user) to interact with computer system 220 and/or one or more communications devices to enable user 236 (e.g., human or machine user) to communicate with computer system 220 using any type of communications link. To this extent, parameter measurement system 240 can manage a set of interfaces (e.g., graphical user interface(s), application program interface, and/or the like) that enable human and/or system interaction with parameter measurement system 240.

In any event, computer system 220 can comprise one or more general purpose computing articles of manufacture (e.g., computing devices) capable of executing program code installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, parameter measurement system 220 can be embodied as any combination of system software and/or application software. In any event, the technical effect of computer system 220 is to selectively measure parameters, including unity gain frequency, on a MOSFET 100.

Further, parameter measurement system 240 can be implemented using a set of modules 232. In this case, a module 232 can enable computer system 220 to perform a set of tasks used by parameter measurement system 240, and can be separately developed and/or implemented apart from other portions of parameter measurement system 240. Parameter measurement system 240 may include modules 232 which comprise a specific use machine/hardware and/or software. Regardless, it is understood that two or more modules, and/or systems may share some/all of their respective hardware and/or software. Further, it is understood that some of the functionality discussed herein may not be implemented or additional functionality may be included as part of computer system 220.

When computer system 220 comprises multiple computing devices, each computing device may have only a portion of parameter measurement system 240 embodied thereon (e.g., one or more modules 232). However, it is understood that computer system 220 and parameter measurement system 240 are only representative of various possible equivalent computer systems that may perform a process described herein. To this extent, in other embodiments, the functionality provided by computer system 220 and parameter measurement system 240 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 220 includes multiple computing devices, the computing devices can communicate over any type of communications link. Further, while performing a process described herein, computer system 220 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, parameter measurement system 240 enables computer system 220 to control measurement of MOSFET 100 parameters, including unity gain frequency. Parameter measurement system 240 may include logic for performing one or more actions described herein. In one embodiment, parameter measurement system 240 may include logic to perform the above-stated functions. Structurally, the logic may take any of a variety of forms such as a field programmable gate array (FPGA), a microprocessor, a digital signal processor, an application specific integrated circuit (ASIC) or any other specific use machine structure capable of carrying out the functions described herein. Logic may take any of a variety of forms, such as software and/or hardware. However, for illustrative purposes, parameter measurement system 240 and logic included therein will be described herein as a specific use machine. As will be understood from the description, while logic is illustrated as including each of the above-stated functions, not all of the functions are necessary according to the teachings as recited in the appended claims.

Figure 3:
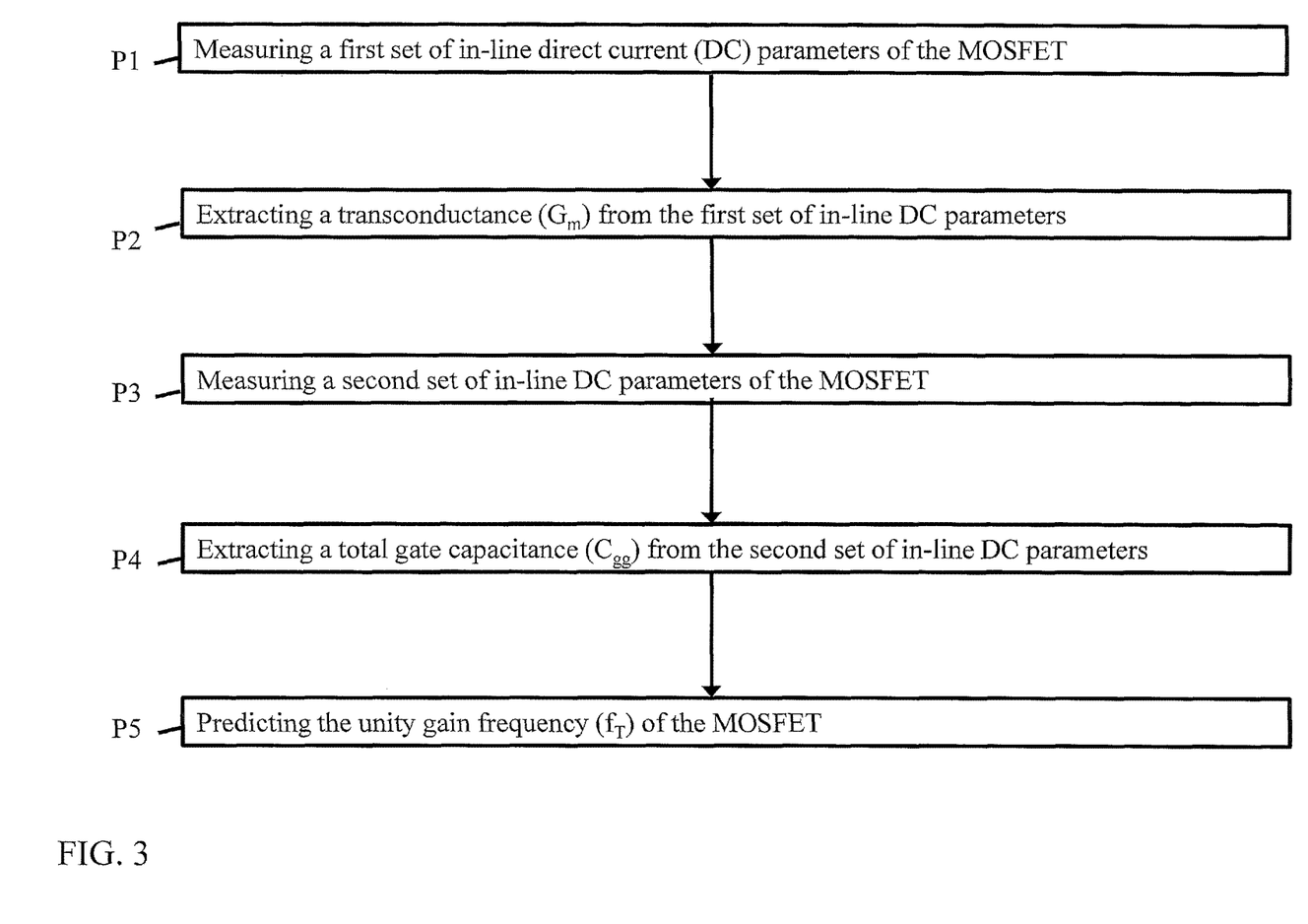
FIG. 3 shows a flow diagram depicting a process according to various embodiments.

Turning to FIG. 3, the flow diagram depicting the method of predicting a unity gain frequency in a MOSFET device in a manufacturing line can include the following processes:

P1: measuring a first set of in-line direct current (DC) parameters of the MOSFET on the manufacturing line at a first drain voltage ($V_{d1}$). In particular embodiments, the first set of in-line direct current parameters of MOSFET 100 are measured on drain 135 and gate 125 of MOSFET 100, as shown in FIG. 1. In some cases, measurements of the first set of in-line direct current parameters of MOSFET 100, and all additional in-line direct current parameters of MOSFET 100 disclosed herein, can be obtained with measurement tool 214. Measurement tool 214 may include a digital multimeter, an oscilloscope, an oscillograph, or any comparable electronic test instrument. The measurement tool may have a user interface 216. Tool 214 may be applied manually to MOSFET 100 by a user, or in separate embodiments, tool 214 may be included in system 280 further including computer system 220, as is shown in FIG. 2.

In various embodiments, the first set of in-line DC parameters may include a drain-current gate-voltage characteristic. In various embodiments, the drain-current gate-voltage characteristic is the relationship, typically, but not necessarily, in the form of a chart or graph, between the drain-current through MOSFET 100 and the gate-voltage across MOSFET 100. Alternatively, this can be expressed as $I_d$ v. $V_g$. Additionally, the desired first drain voltage may be approximately equal to a range of drain voltages selected to be representative of a range of drain voltages expected in MOSFET 100. It is understood that separate devices (e.g., MOSFET 100) of the same design might be used in application with such different drain voltages that no one drain-voltage would adequately represent all circuit applications. Therefore, a range of drain voltages can most accurately represent the $V_g$ that must be selected for evaluating the transconductance and total gate capacitance.

To achieve the first drain voltage, a voltage is applied through at least a first power supply 244 to MOSFET 100. In various embodiments, power supply 244 can be a functional power supply, a variac, or any other programmable power source. Specifically, the voltage may be applied to source 130 of MOSFET 100. Optionally, a digital multimeter, an oscilloscope, oscillograph, or comparable electronic test instrument, can be used to verify the value of the first drain voltage. It is understood that adjusting the drain-voltage may consequently affect the measurement of the first set of in-line DC parameters. For example, the transconductance is typically greater for a larger drain bias.

P2: After measuring the first set of in-line DC parameters, the method can include extracting the transconductance ($G_m$) from the first set of in-line DC parameters as a function of a gate-voltage ($V_g$) and the first drain-voltage ($V_{d1}$). This can be written as, $G_m$ ($V_g$, $V_{d1}$). It is understood that the transconductance is the ratio of the current change at the output port to the voltage change at the input port. For direct current, this can be expressed as:

$$G_m = \frac{\Delta I_{out}}{\Delta V_{in}}.$$

Where, $\Delta I_{out}$ is the current change at the output port, and $\Delta V_{in}$ is the voltage change at the input port. For a small signal alternating current, this can be expressed as:

$$G_m = \frac{I_{out}}{V_{in}}.$$

Where, $I_{out}$ is the current at the output port, and $V_{in}$ is the voltage at the input port. According to an embodiment, the transconductance can be extracted by numerically differentiating $I_d$ with respect to $V_g$.

In various embodiments, the extraction of $G_m$ ($V_g$, $V_{d1}$) can be performed using parameter measurement system 240. Referring to FIG. 2, computer system 220 can receive a measured data return 254, where measured data return 254 includes the gate-voltage ($V_g$) and the first drain-voltage ($V_{d1}$). Upon receipt of measured data return 254, computer system 220 may extract the transconductance $G_m$ ($V_g$, $V_{d1}$), according to the formulation disclosed herein.

P3: Following extracting the transconductance ($G_m$) from the first set of in-line DC parameters as a function of a gate-voltage ($V_g$) and the first drain-voltage ($V_{d1}$), the method can include measuring a second set of in-line DC parameters of the MOSFET on the manufacturing line at a second drain voltage ($V_{d2}$). In various embodiments, the second set of in-line DC parameters of MOSFET 100 device may include a total gate capacitance gate-voltage ($C_{gg}V_g$) characteristic. In various embodiments, the total gate capacitance gate-voltage characteristic is the relationship, typically, but not necessarily, in the form of a chart or graph, between the total gate capacitance of MOSFET 100 and the gate-voltage across MOSFET 100. In an embodiment, the gate-voltage is varied, and the total gate capacitance is plotted as a function of the gate-voltage. Alternatively, this can be expressed as $C_{gg}$ v. $V_g$.

As disclosed herein, tool 214 may be applied to MOSFET 100 to obtain the second set of in-line DC parameters of MOSFET 100. In various embodiments, the second drain voltage is equal to approximately zero when the second set of in-line DC parameters of MOSFET 100 are measured. To obtain a second drain voltage of zero, the drain terminal is grounded or controlled through a sense measurement unit (SMU).

P4: Following measuring a second set of in-line DC parameters of MOSFET 100 on the manufacturing line at a second drain voltage ($V_{d2}$), the method can include extracting a total gate capacitance ($C_{gg}$) from the second set of in-line DC parameters as a function of the gate-voltage ($V_g$). The extraction can be written as, $C_{gg}(V_g)$. It is understood that $C_{gg}$ represents the total capacitance of MOSFET 100 as is seen from gate 125. In various embodiments, $C_{gg}$ can be extracted using an LCR meter (also known as an impedance analyzer). Internally, this tool calculates $C_{gg}$ for a small sinusoidal input voltage $V_g$. In various embodiments the extraction of $C_{gg}(V_g)$, can be performed using parameter measurement system 240. Referring to FIG. 2, computer system 220 can receive a measured data return 254, wherein measured data return 254 includes the gate-voltage ($V_g$). Upon receipt of measured data return 254, computer system 220 may extract the total gate capacitance $C_{gg}(V_g)$.

P5: Following extracting a total gate capacitance ($C_{gg}$) from the second set of in-line DC parameters as a function of the gate-voltage ($V_g$), the method can include predicting the unity gain frequency ($f_T$) of MOSFET 100 based upon the extracted transconductance ($G_m$) and the extracted total gate capacitance ($C_{gg}$). The unity gain frequency of a symmetric MOSFET device can be expressed as:

$$f_T = \frac{G_m(V_g, V_d)}{2*\pi*C_{gg}(V_g, V_d)}.$$

The unity gain frequency can be approximated when the drain voltage is set to zero:

$$f_T = \frac{G_m(V_g, V_d)}{2*\pi*C_{gg}(V_g, 0)}.$$

For a symmetric and asymmetric MOSFET, it is understood that that unity gain frequency can be predicted as:

$$f_T = \frac{G_m(V_g, V_d)}{f(R_{ds}(V_g, V_d), C_{gg}(V_d, 0))},$$

where $f(R_{ds}(V_g, V_d), C_{gg}(V_g, 0))$, is expressed as:

$B_0+B_1*R_{ds}+B_2*C_{gg}(V_g, 0)+B_3*R_{ds}*C_{gg}(V_g, 0)$.

According to various embodiments, B values are the values extracted during calibration. These values are obtained through suitable statistical analysis. For example, multiple regression can be used.

The radio-frequency parameter, $f_T$ is correlated to in-line measurable DC parameters $G_m$, $R_{ds}$, and $C_{gg}$. As such, according to various embodiments, $f_T$ can be predicted as:

$$f_T = \frac{G_m}{2*\pi*C_{gg}}.$$

According to various embodiments, the process flow as depicted in FIG. 3 may be repeated for a given MOSFET device (e.g., MOSFET 100) on a number of chips, wafers, or lots in a manufacturing line. Additionally, the process flow may be repeated on a single given MOSFET device (e.g., MOSFET 100). In further embodiments, parameter measurement system 240 can perform this prediction.

Figure 4A:
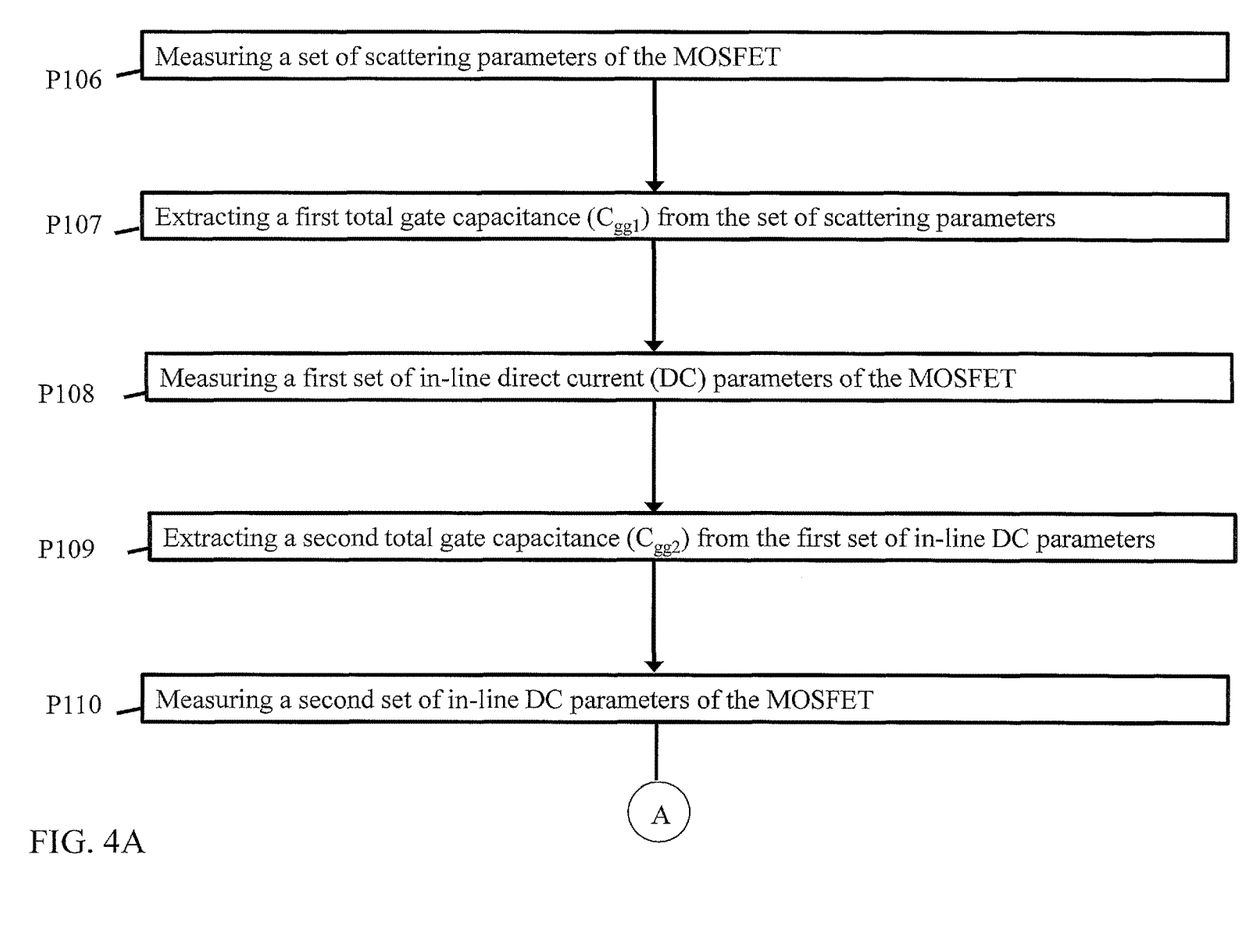
FIGS. 4A-B show a flow diagram depicting a process according to additional embodiments.
Figure 4B:
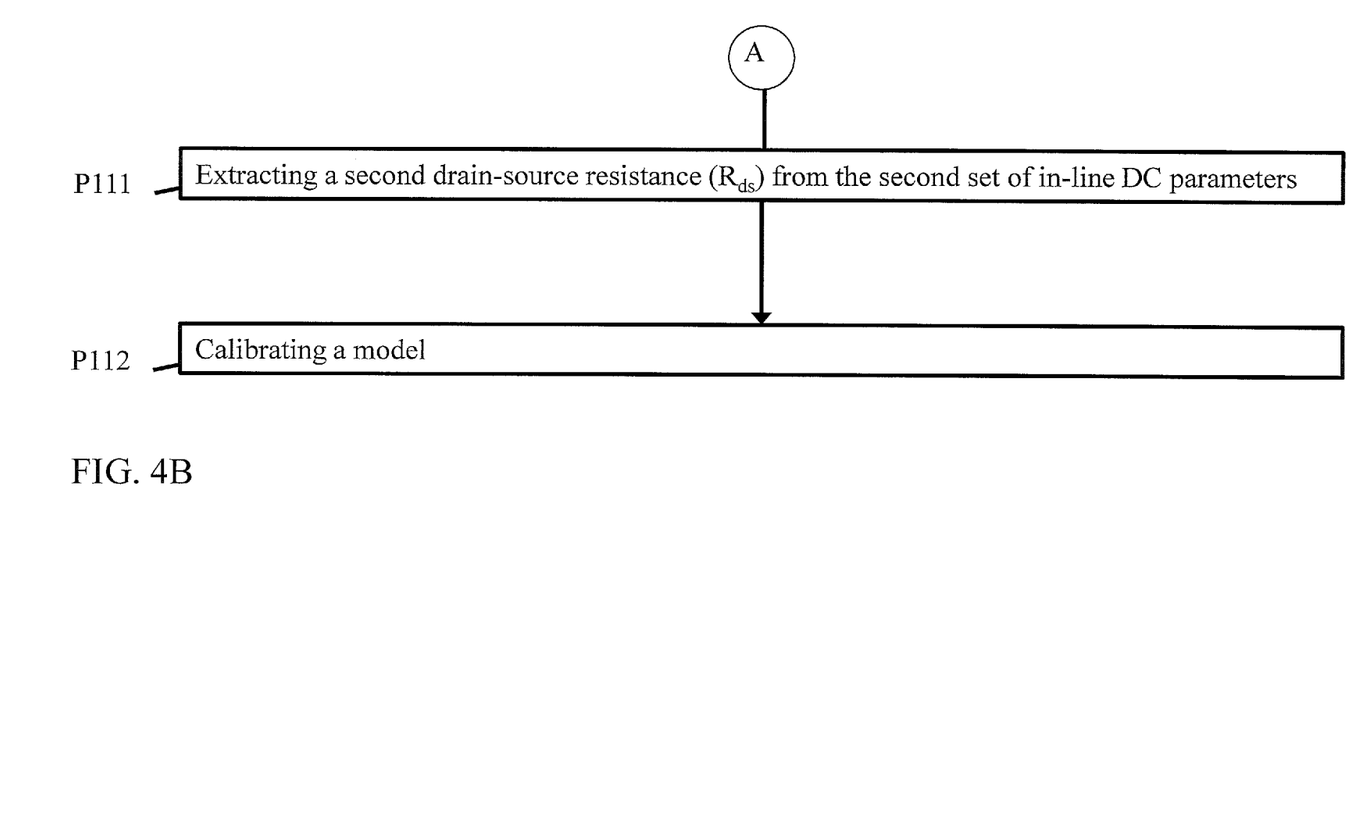

Turning to FIG. 4A and FIG. 4B, the flow diagram depicting the method of calibrating a model for a metal-oxide-semiconductor field-effect transistor (MOSFET) device, can include the following processes:

P106: measuring a set of scattering parameters of MOSFET 100 at a first gate-voltage ($V_{g1}$) and a first drain-voltage ($V_{d1}$). It is understood that scattering parameters (S-parameters) describe the performance of linear electrical networks. In various embodiments, S-parameters are measured with a network analyzer. In various embodiments, this measurement is performed only once, and off of the manufacturing line. This instrument applies an input signal to MOSFET 100. In various embodiments, the applied signal is a high frequency AC signal. The instrument simultaneously measures the complex output signal and the reflected signal at the input frequency. The network analyzer solves a set of linear equations to represent these signals as the scattering parameters. In various embodiments, the first drain voltage may be equal to approximately a range of voltages selected to be representative of a range of drain-voltages expected in MOSFET 100, and the first gate-voltage may approximately equal to a range of voltages selected to be representative of a range of gate-voltages expected in MOSFET 100.

P107: Following measuring a set of scattering parameters of MOSFET 100 at a first gate-voltage ($V_{g1}$) and a first drain-voltage ($V_{d1}$), the method can include extracting a first total gate capacitance ($C_{gg1}$) from the set of scattering parameters as a function of the first gate-voltage ($V_{g1}$) and the first drain-voltage ($V_{d1}$). This can be written as $C_{gg1}(V_{g1}, V_{d1})$. $C_{gg1}(V_{g1}, V_{d1})$ is obtained from the imaginary parts of Y11 of the measured scattering parameters. As is understood, Y11 represents an admittance parameter (Y parameter) of a linear circuit where Y is an N by N matrix indexed using conventional matrix notation.

P108: Following extracting a first total gate capacitance ($C_{gg1}$) from the set of scattering parameters as a function of the first gate-voltage ($V_{g1}$) and the first drain-voltage ($V_{d1}$), the method can include measuring a first set of in-line direct current (DC) parameters of MOSFET 100 at a second drain voltage ($V_{d2}$). In various embodiments, the first set of in-line DC parameters includes a total gate capacitance gate-voltage ($C_{gg}V_{g1}$) characteristic. In various embodiments, the total gate capacitance gate-voltage characteristic is the relationship, typically, but not necessarily, in the form of a chart or graph, between the total gate capacitance of MOSFET 100 and the gate-voltage across MOSFET 100. In an embodiment, the gate-voltage is varied, and the total gate capacitance is plotted as a function of the gate-voltage. Alternatively, this can be expressed as $C_{gg}$ v. $V_{g1}$. Additionally, the second drain voltage may be equal to approximately zero.

P109: Following measuring a first set of in-line direct current (DC) parameters of MOSFET 100 at a second drain voltage ($V_{d2}$), the method can include extracting a second total gate capacitance ($C_{gg2}$) from the first set of in-line DC parameters as a function of a second gate-voltage ($V_{g2}$). This can be written as $C_{gg2}(V_{g2})$. In various embodiments, $C_{gg2}$ can be extracted using an LCR meter (also known as an impedance analyzer). Internally, this tool calculates $C_{gg2}$ for a small sinusoidal input voltage $V_g$.

P110: Following extracting a second total gate capacitance ($C_{gg2}$) from the first set of in-line DC parameters as a function of a second gate-voltage ($V_{g2}$), the method can include measuring a second set of in-line DC parameters of MOSFET 100 at the first drain voltage ($V_{d1}$). In various embodiments the second set of in-line DC parameters of MOSFET device 100 can include a drain-current gate-voltage ($I_dV_{g2}$) characteristic. In various embodiments, the drain-current gate-voltage characteristic is the relationship, typically, but not necessarily, in the form of a chart or graph, between the drain-current through MOSFET 100 and the gate-voltage across MOSFET 100. Alternatively, this can be expressed as $I_d$ v. $V_{g2}$. Furthermore, the third drain voltage may be equal to approximately to a range of drain voltages selected to be representative of a range of drain voltages expected in MOSFET 100.

P111: Following measuring a second set of in-line DC parameters of MOSFET 100 at the first drain voltage ($V_{d1}$), the method can include extracting a drain-source resistance ($R_{ds}$) from the second set of in-line DC parameters as a function of the first gate-voltage ($V_{g1}$) and the first drain voltage ($V_{d1}$). It is understood that the drain-source resistance is the resistance between drain 135 and source 130. According to various embodiments, the drain-source resistance can be extracted by differentiating the $I_d$ v. $V_d$ curve:

$$R_{ds} = \frac{1}{\left(\frac{dI_d}{dV_d}\right)}.$$

P112: Following extracting a drain-source resistance ($R_{ds}$) from the second set of in-line DC parameters as a function of the first gate-voltage ($V_{g1}$) and the first drain voltage ($V_{d1}$), the method can include calibrating a model using the first total gate capacitance, the second total gate capacitance, and the drain-source resistance. According to various embodiments, the model for the MOSFET 100 can be calibrated according to the equation:

$$C_{gg1}(V_{g1}, V_{d1}) = f(R_{ds}, C_{gg2}(V_{g2})).$$

This is extracted using statistical regression techniques from the S-parameter data, as described herein.

Figure 5:
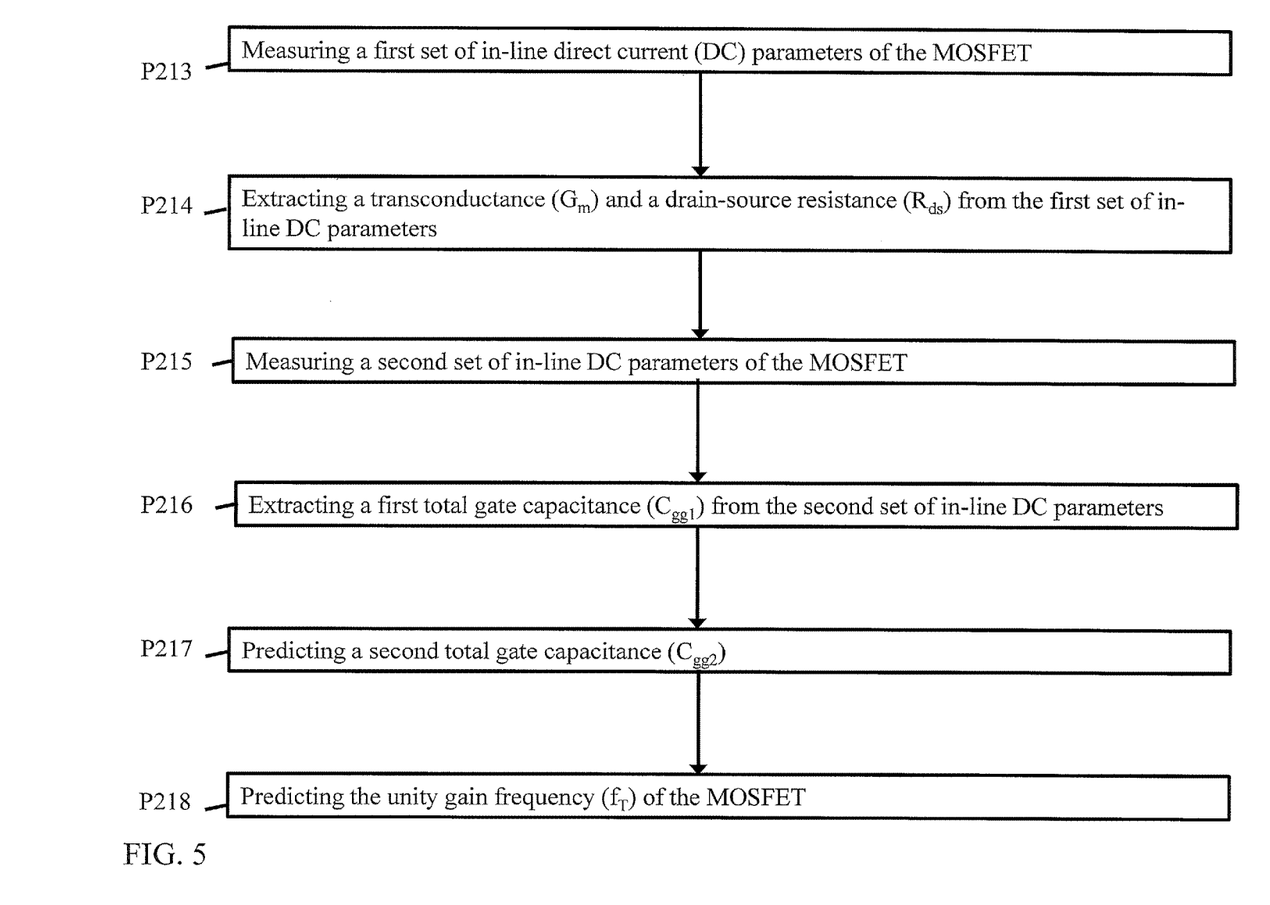
FIG. 5 shows a flow diagram depicting a process according to further embodiments.

Turning to FIG. 5, the flow diagram depicting a method of predicting a unity gain frequency in a MOSFET device in a manufacturing line can include the following processes:

P213: measuring a first set of in-line direct current (DC) parameters of MOSFET 100 on the manufacturing line at a first drain voltage ($V_{d1}$). In various embodiments, the first set of in-line DC parameters may include a drain-current gate voltage ($I_dV_{g1}$) characteristic. In various embodiments, the drain-current gate-voltage characteristic is the relationship, typically, but not necessarily, in the form of a chart or graph, between the drain-current through MOSFET 100 and the gate-voltage across MOSFET 100. Alternatively, this can be expressed as $I_d$ v. $V_{g1}$. Furthermore, in additional embodiments the first drain voltage may be approximately equal to a range of drain voltages selected to be representative of a range of drain voltages expected in MOSFET 100. To achieve the first drain voltage, a voltage is applied through at least a first power supply 244 to MOSFET 100. In various embodiments, power supply 244 can be a functional power supply, a variac, or any other programmable power source. Specifically, the voltage may be applied to source side 130 of MOSFET 100. Optionally, an oscilloscope, oscillograph, or comparable electronic test instrument, can be used to verify the value of the first drain voltage.

P214: Following measuring a first set of in-line direct current (DC) parameters of MOSFET 100 on the manufacturing line at a first drain voltage ($V_{d1}$), the method can include extracting a transconductance ($G_m$) and a drain-source resistance ($R_{ds}$) from the first set of in-line DC parameters as a function of a first gate-voltage ($V_{g1}$) and the first drain-voltage ($V_{d1}$). These parameters can be written as $G_m(V_{g1}, V_{d1})$ and $R_{ds}(V_{g1}, V_{d1})$, respectively. As disclosed herein, transconductance can be expressed as:

$$G_m = \frac{\Delta I_{out}}{\Delta V_{in}}.$$

According to an embodiment, this transconductance can be extracted by numerically differentiating $I_d$ with respect to $V_g G_m$.

Similarly, $R_{ds}(V_{g1}, V_{d1})$ can be extracted as:

$$\frac{V_{d1}}{I_{d1}} \text{ or } \frac{dV_{d1}}{dI_{d1}}.$$

P215: Following extracting a transconductance ($G_m$) and a drain-source resistance ($R_{ds}$) from the first set of in-line DC parameters as a function of a first gate-voltage ($V_{g1}$) and the first drain-voltage ($V_{d1}$), the method can include measuring a second set of in-line DC parameters of MOSFET 100 on the manufacturing line at a second drain voltage ($V_{d2}$). According to various embodiments, the second set of in-line DC parameters can include a total gate capacitance gate-voltage ($C_{gg}V_{g1}$) characteristic. In various embodiments, the total gate capacitance gate-voltage characteristic is the relationship, typically, but not necessarily, in the form of a chart or graph, between the total gate capacitance of MOSFET 100 and the gate-voltage across MOSFET 100. In an embodiment, the gate-voltage is varied, and the total gate capacitance is plotted as a function of the gate-voltage. Alternatively, this can be expressed as $C_{gg}$ v. $V_{g1}$. Furthermore, the second drain voltage can be equal to approximately zero.

P216: Following measuring a second set of in-line DC parameters of MOSFET 100 on the manufacturing line at a second drain voltage ($V_{d2}$), the method can include extracting a first total gate capacitance ($C_{gg1}$) from the second set of in-line DC parameters as a function of the first gate-voltage ($V_{g1}$). This can be written as $C_{gg}(V_g)$. In various embodiments, $C_{gg}$ can be extracted using an LCR meter (also known as an impedance analyzer).

P217: Following extracting a first total gate capacitance ($C_{gg1}$) from the second set of in-line DC parameters as a function of the first gate-voltage ($V_{g1}$), the method can predicting a second total gate capacitance ($C_{gg2}$) as a function of the first gate-voltage ($V_{g1}$) and the first drain-voltage ($V_{d1}$) from a calibration model. According to various embodiments, MOSFET 100 can be calibrated according to the equation:

$$C_{gg2}(V_{g1}, V_{d1})' = f(R_{ds}, C_{gg2}(V_{g2})).$$

P218: Following predicting a second total gate capacitance ($C_{gg2}$) as a function of the first gate-voltage ($V_{g1}$) and the first drain-voltage ($V_{d1}$) from a calibration model, the method can include predicting the unity gain frequency ($f_T$) of MOSFET 100 based upon the extracted transconductance ($G_m$) and the second total gate capacitance ($C_{gg2}$). According to various embodiments, the unity gain frequency of MOSFET 100 can be predicted according to:

$$f_T = \frac{G_m}{2*\pi*C_{gg2}(V_{g1}, V_{d1})'}.$$

According to various embodiments, the process flow as depicted in FIG. 3 may be repeated for a given MOSFET (e.g., MOSFET 100) on a number of chips, wafers, or lots in a manufacturing line. Additionally, the process flow may be repeated on a single given MOSFET (e.g., MOSFET 100).

It is understood that the methods described according to various embodiments can allow for measurement of the unity gain frequency of a MOSFET device in a manufacturing line using in-line DC parameters, which in contrast to conventional approaches, does not necessitate the use of S-parameters. These methods can be utilized to reduce costs in manufacturing and increase efficiency.

In various embodiments, the processes disclosed herein can be performed with or in conjunction with a neural network. As is understood, neural networks provide a computation model that is capable of machine learning and pattern recognition. For example, an array of $C_{gg}$ or $f_T$ samples for a MOSFET (e.g., MOSFET 100) can be measured according to processes disclosed herein. The samples are then collected by the neural network, and used by a training algorithm therein to output a desired characteristic for a MOSFET.

In various embodiments, Processes P1-5, and P213-218 can be iterated (repeated) periodically (e.g., according to schedule of x times per y period, and/or continuously) in order to measure one more parameters of a MOSFET 100. In some cases, one or more of processes P1-5 and P213-218 can be repeated, for example, for a set of MOSFET 100.

It is understood that in the flow diagram shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

In any case, the technical effect of the various embodiments, including, e.g., parameter measurement system 240, is to control measurement of MOSFET 100 parameters, including unity gain frequency.

In various embodiments, components described as being "coupled" to one another can be joined along one or more interfaces. In some embodiments, these interfaces can include junctions between distinct components, and in other cases, these interfaces can include a solidly and/or integrally formed interconnection. That is, in some cases, components that are "coupled" to one another can be simultaneously formed to define a single continuous member. However, in other embodiments, these coupled components can be formed as separate members and be subsequently joined through known processes (e.g., fastening, ultrasonic welding, bonding).

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose various embodiments, including the best mode, and also to enable any person skilled in the art to practice, including making and using any devices or systems and performing any incorporated methods. The patentable scope of the various embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method of predicting a unity gain frequency ($f_T$) in a metal-oxide-semiconductor field-effect transistor (MOSFET) device in a manufacturing line, the method comprising:

measuring a first set of in-line direct current (DC) parameters of the MOSFET on the manufacturing line at a first drain voltage ($V_{d1}$);

extracting a transconductance ($G_m$) from the first set of in-line DC parameters as a function of a gate-voltage ($V_g$) and the first drain-voltage ($V_{d1}$);

measuring a second set of in-line DC parameters of the MOSFET on the manufacturing line at a second drain voltage ($V_{d2}$), wherein the second drain voltage ($V_{d2}$) is distinct from the first drain-voltage ($V_{d1}$);

extracting a total gate capacitance ($C_{gg}$) from the second set of in-line DC parameters as a function of the gate-voltage ($V_g$); and predicting the unity gain frequency ($f_T$) of the MOSFET based upon the extracted transconductance ($G_m$) and the extracted total gate capacitance ($C_{gg}$), wherein the unity gain frequency ($f_T$) is calculated according to the equation:

$$f_T = \frac{G_m}{2*\pi*C_{gg}}.$$

2. The method of claim 1, wherein the first set of in-line DC parameters includes a drain-current gate-voltage ($I_dV_g$) characteristic.

3. The method of claim 1, wherein the second set of in-line DC parameters includes a total gate capacitance gate-voltage ($C_{gg}V_g$) characteristic.

4. The method of claim 1, wherein the second drain voltage is equal to approximately zero.

5. The method of claim 1, wherein the MOSFET includes a multi-finger MOSFET having a channel width larger than a channel length, with a perimeter defined along a drain.

6. A method of predicting a unity gain frequency ($f_T$) in a metal-oxide-semiconductor field-effect transistor (MOSFET) device in a manufacturing line, the method comprising:

measuring a first set of in-line direct current (DC) parameters of the MOSFET on the manufacturing line at a first drain voltage ($V_{d1}$);

extracting a transconductance ($G_m$) from the first set of in-line DC parameters as a function of a gate-voltage ($V_g$) and the first drain-voltage ($V_{d1}$);

measuring a second set of in-line DC parameters of the MOSFET on the manufacturing line at a second drain voltage ($V_{d2}$), wherein the second drain voltage ($V_{d2}$) is distinct from the first drain-voltage ($V_{d1}$);

extracting a total gate capacitance ($C_{gg}$) from the second set of in-line DC parameters as a function of the gate-voltage ($V_g$); and predicting the unity gain frequency ($f_T$) of the MOSFET based upon the extracted transconductance ($G_m$) and the extracted total gate capacitance ($C_{gg}$).

7. The method of claim 6, wherein the second drain voltage is equal to approximately zero.

* * * * *